United States Patent
Toyama et al.

(10) Patent No.: US 8,259,290 B2
(45) Date of Patent: Sep. 4, 2012

(54) DIFFRACTIVE OPTICAL DEVICE, AND ALIGNER COMPRISING THAT DEVICE

(75) Inventors: Nobuhito Toyama, Shinjuku-Ku (JP); Ryuji Horiguchi, Shinjuku-Ku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 402 days.

(21) Appl. No.: 12/091,926

(22) PCT Filed: Apr. 10, 2007

(86) PCT No.: PCT/JP2007/058227
§ 371 (c)(1),
(2), (4) Date: Apr. 28, 2008

(87) PCT Pub. No.: WO2007/119840
PCT Pub. Date: Oct. 25, 2007

(65) Prior Publication Data
US 2009/0168040 A1 Jul. 2, 2009

(30) Foreign Application Priority Data

Apr. 12, 2006 (JP) .................. 2006-109723

(51) Int. Cl.
*G03B 27/42* (2006.01)
*G03B 27/54* (2006.01)
*G03B 27/72* (2006.01)

(52) U.S. Cl. ................ 355/71; 355/53; 355/67

(58) Field of Classification Search .............. 250/492.2; 355/53, 67, 71; 359/558–576; 430/5
See application file for complete search history.

(56) References Cited

U.S. PATENT DOCUMENTS

| | | | |
|---|---|---|---|
| 6,855,486 B1 * | 2/2005 | Finders et al. ............... 355/53 |
| 7,537,870 B2 * | 5/2009 | Crouse et al. ............... 355/67 |
| 2001/0001247 A1 | 5/2001 | Finders et al. |
| 2001/0003480 A1 * | 6/2001 | Ryuk et al. ................. 355/53 |
| 2001/0046038 A1 | 11/2001 | Mulkens et al. |

(Continued)

FOREIGN PATENT DOCUMENTS

EP 1577709 A2 9/2005

(Continued)

*Primary Examiner* — Hung Henry Nguyen
*Assistant Examiner* — Colin Kreutzer
(74) *Attorney, Agent, or Firm* — Sughrue Mion, PLLC

(57) ABSTRACT

The invention relates to a pupil filter used for the illumination optical system of a semiconductor aligner or the like that can prevent a decrease in the quantity of light having transmitted through it, enhance the efficiency of semiconductor exposure, reduce loads of correction by the optical proximity effect and yield a stable yet high-resolution optical image without engendering size fluctuations of a pattern imaged on a wafer depending on a mask pattern pitch. Specifically, the invention provides a diffractive optical device for the formation of a pupil filter used for the illumination optical system of an aligner adapted to direct light emanating from a light source to a mask via an illumination optical system and project a pattern on the mask onto an alignment substrate and exposing it to light via a projection optical system. The pupil filter formed by the diffractive optical device is a dipole pupil comprising two light transmissive areas (11). The two light transmissive areas (11) are in a fan-form configuration symmetric at a given distance from the center of the pupil filter, between them there is an area (12) of low light transmittance, and outside the two light transmissive areas (11) and the area (12) of low light transmittance there is a light block area (13).

3 Claims, 11 Drawing Sheets

U.S. PATENT DOCUMENTS

| | | |
|---|---|---|
| 2002/0152452 A1 | 10/2002 | Socha |
| 2002/0167653 A1 | 11/2002 | Mulkens et al. |
| 2003/0156266 A1 | 8/2003 | Tanitsu |
| 2003/0214643 A1 | 11/2003 | Eurlings et al. |
| 2004/0051858 A1 | 3/2004 | Mulkens et al. |
| 2005/0046945 A1 | 3/2005 | Hwang |
| 2005/0206871 A1 | 9/2005 | Tsuji |
| 2006/0012769 A1 | 1/2006 | Suzuki |
| 2006/0250600 A1 | 11/2006 | Tsuji |
| 2008/0297753 A1* | 12/2008 | Wang et al. ............ 355/67 |

FOREIGN PATENT DOCUMENTS

| | | |
|---|---|---|
| JP | 2000-58441 A | 2/2000 |
| JP | 2001-217188 A | 8/2001 |
| JP | 2002-334836 A | 11/2002 |
| JP | 2005-93522 A | 4/2005 |
| JP | 2005-268489 A | 9/2005 |

* cited by examiner

Resolving power (130 nm pitch contrast)

Stability

Resolving power
(130 nm pitch contrast)

Stability

Resolving power
(130 nm pitch contrast)

Stability

Resolving power (130 nm pitch contrast)

Stability

Resolving power (130 nm pitch contrast)

Stability

Exit angle of the hologram device; minimum pitch and the number of steps

Prior Art
FIG. 10(a)
Prior Art
FIG. 10(b)
Round pupil filter for ordinary illumination
Dipole pupil filter for modified illumination
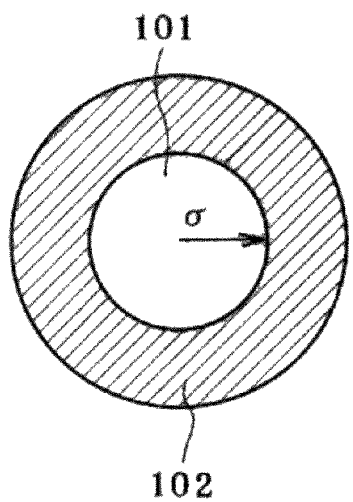
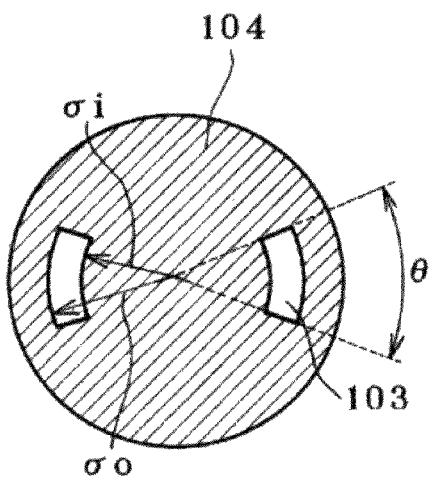
FIG. 11(a)  FIG. 11(b)  FIG. 11(c)
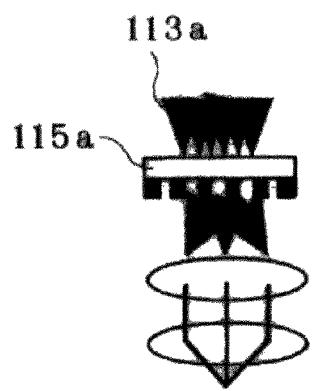
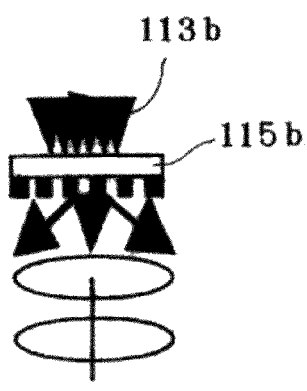
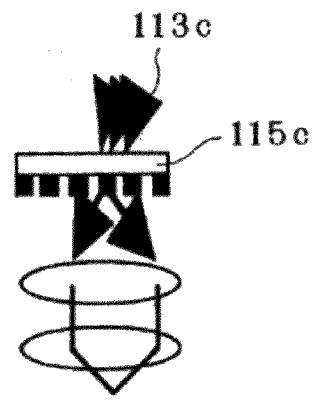

Ordinary illumination    $\sigma=0.5$

Modified illumination    $\sigma o=0.95$    $\sigma i=0.7$    $\theta=45°$

DIFFRACTIVE OPTICAL DEVICE, AND ALIGNER COMPRISING THAT DEVICE

TECHNICAL ART

The present invention relates to a diffractive optical device for forming a pupil filter used for projection aligners utilized for the formation of semiconductor device patterns or the like, and an aligner comprising that diffractive optical device.

BACKGROUND ART

The step called generally photolithography is needed for the formation of circuit patterns for semiconductor devices. For this step, usually, there is a transfer process used, which transfers a photomask (often called the reticle, and hereinafter called simply the "mask" pattern onto the alignment substrate such as a semiconductor wafer. The alignment substrate is coated with a photosensitive photoresist, and a circuit pattern is transferred onto the photoresist depending on the pattern shape of the mask pattern. And at a projection aligner, the image of the circuit pattern written on the mask and to be transferred is projected onto the alignment substrate (wafer) and exposed to light by way of a projection optical system.

In photolithography, the minimum size (resolution) that can be transferred with the projection aligner is proportional to the wavelength of light used for exposure yet in inverse proportion to the numerical aperture (NA) of a projection optical system; so with a growing demand for recent finer and finer semiconductor devices, exposure light wavelengths are growing shorter and the NA of the projection optical system is growing larger. Only by use of such shorter wavelength and larger NA, there is still a limit to meeting this demand.

To bring up resolution, there has recently been ultra-resolution technologies proposed, according to which the value of a process constant kl (kl=resolution line width×numerical aperture of the projection optical system×wavelength of exposure light) is made small enough to achieve ever finer patterning. Such ultra-resolution technologies, for instance, include an optimization method of giving an auxiliary pattern or line width offset to a mask pattern depending on the characteristics of an aligner optical system, and a method called the modified illumination method (also called the oblique incidence illumination or multipole illumination method). For the modified illumination method, for instance, dipole illumination, and quadrapole illumination is used.

FIG. 9 is illustrative in schematic of the general setup of an aligner system in a semiconductor-specific aligner, which comprises a light source 91 such as an ArF excimer laser and a pupil filter 91 working as a modified illumination means. Illumination light 93 is imaged on a wafer 98 of an alignment substrate by way of a lens 97 that defines a projection optical system. The "pupil filter" here refers to the pupil filter of an illumination optical system that is located on a condenser lens 94 on a mask 95.

FIG. 10 is a schematic top view illustrative of one exemplary configuration of a conventional pupil filter comprising a hatched area defining a light block area and a blank area defining a light transmissive area. More specifically, FIG. 10($a$) is illustrative of an ordinary pupil filter in which most of the round pupil defines a light transmissive area 101 through which light emanating from a light source transmits, with its peripheral area defining a light block area 102. FIG. 10($b$) is illustrative of an exemplary pupil filter configuration for modified illumination, in which the central area defines a light block area 104 and two fan-form light transmissive areas 103 are provided at positions symmetric about the center of the pupil filter.

With such a general round pupil filter as depicted in FIG. 10($a$), the angle of diffraction (t) of diffracted light from the mask is determined by the pattern pitch (d) of the mask and the wavelength (L) of light, as given by the following equation (here n is the degree of diffraction). Accordingly, when a specific light source is used, the angle of diffraction (t) of diffracted light is going to differ depending on the pitch of the mask pattern.

$$\sin(t) = n \times L / d$$

FIG. 11 is illustrative of the relations of the pitch of the mask pattern to diffracted light of illumination light after having passed through the pupil filter.

FIG. 11($a$) is illustrative of the case where the pattern pitch of a mask 115$a$ is large relative to the exposure light wavelength, showing that illumination light 113$a$ is imaged on a wafer surface, forming a good image. However, as semiconductor devices get finer and finer, mask pattern pitches get smaller and smaller, too. FIG. 11($b$) is illustrative of the case where the pattern pitch of a mask 115$b$ is small relative to exposure light wavelength, showing that illumination light 113$b$ is not imaged on a wafer surface, failing to give a good image. FIG. 11($c$) is illustrative of oblique incidence of light under the same conditions as in FIG. 11($b$)—oblique incidence illumination method, showing that illumination light 113$c$ can be imaged on a wafer. Thus, as semiconductor devices grow finer, mask pattern pitches get smaller; so oblique incidence illumination techniques are now in use.

If, to put to practice the oblique incidence illumination technique shown in FIG. 11($c$), the pupil shape of the pupil filter is changed from the conventional round pupil shown in FIG. 10($a$) to the dipole fan-form pupil of FIG. 10($b$) for instance, the middle of the pupil filter could be blocked against light so that light of an oblique component could be incident on it, thereby improving resolving power.

However, the changing of the illumination pupil filter from FIG. 10($a$) to FIG. 10($b$) is found to engender other problems.

One problem comes to arise when the pupil filter of FIG. 10($b$) is achieved by an aperture (generally metal sheet machining); the quantity of light transmitting through the pupil filter of FIG. 10($b$) diminishes or much time is taken for exposure, making the efficiency of semiconductor exposure much worse and, hence, semiconductor fabrication cost much. So far, the use of a diffractive optical device has been proposed to minimize losses of the aforesaid quantity of light (for instance, see Patent Publications 1 and 2).

Because the pupil filter of FIG. 10($b$) is smaller than the pupil filter of FIG. 10($a$) in terms of the area through which illumination light transmits, light leaving the pupil filter becomes light of very strong coherence. This gives rise to another problem.

FIG. 12 is a schematic top view of a pattern indicative of a mask pattern pitch, with a black area defining a light block area; FIG. 12($a$) illustrates a small pitch and FIG. 12($b$) illustrates a large pitch. FIG. 13, with a mask pattern pitch as abscissa and an optical image contrast as ordinate, is illustrative of the relations of the mask pattern pitch to the coherence of illumination light leaving the pupil filter. In FIG. 13, a curve (a) is about a round pupil and a curve (b) is about a fan-form pupil.

As the mask pattern pitch becomes small and narrow on the mask, it causes the contrast to go down starkly and the resolving power to drop under ordinary illumination using the round pupil, as shown by the curve (a) in FIG. 13. With a large and wide pitch, however, there is the contrast staying stable.

As shown by the curve (b) in FIG. 13, on the other hand, modified illumination using the fan-form pupil keeps the contrast high to where the pitch is small. As the pattern pitch varies, however, it causes the contrast to change regularly or become erratic. This means that there is a fluctuation in the size of a pattern imaged on the wafer due to the mask pattern pitch. To make correction of that fluctuation, powerful correction techniques such as OPC (optical proximity correct) are in need. However, illumination light leaving the pupil filter is of high coherence; that is, there is a wider extent to which OPC must be applied, which imposes too much load to data processing, giving rise to a problem: correction by OPC is difficult, if not impossible.

Patent Publication 1: JP(A)2001-174615
Patent Publication 2: JP(A)2005-243953

DISCLOSURE OF THE INVENTION

In view of such problems as briefed above, the present invention has been made. That is, an object of the invention is to provide a pupil filter used with an illumination optical system for semiconductor aligners or the like, which works for preventing a decrease in the quantity of light transmitting through it, enhancing semiconductor alignment efficiency, cutting back on loads on optical proximity correction, and holding back fluctuations of the size of a pattern imaged on a wafer due to a mask pattern pitch, so making sure an optical image of stable yet high resolution.

According to the first aspect of the invention, that object is accomplishable by the provision of a pupil filter-formation diffractive optical device used with an illumination optical system for an aligner in which light emanating from a light source is directed to a mask via said illumination optical system so that a pattern on said mask is projected and exposed to light on an alignment substrate via a projection optical system, characterized in that a pupil filter formed by said diffractive optical device is a dipole pupil comprising two light transmissive areas, wherein said two light transmissive areas are in a fan-like shape symmetric about a given distance from the center of said pupil filter, an area of low light transmittance lies between said two light transmissive areas, and there is a light block area outside said two light transmissive areas and said area of low light transmittance.

According to the second aspect of the invention, the aforesaid pupil filter-formation diffractive optical device is further characterized in that said area of low light transmittance is in a substantially oval shape.

According to the third aspect of the invention, the pupil film-formation diffractive optical device according to the first or second aspect is further characterized in that parameters σi, σo and θ are within the following ranges, and parameters ci and R/r are within the following ranges:

$0.65 < \sigma i < 0.75$ $0.8 < \sigma o < 0.9$ $40° < \theta < 50°$ $5\% < ci < 10\%$ $1.5 < R/r < 1.9$ where σi and σo are the inner and outer diameters of each of said two light transmissive areas; θ is the angular aperture at which said two light transmissive areas subtend the center of said pupil filter; 1 is the radius of said pupil filter; ci is the intensity of light having transmitted through said area of low light transmittance provided that the intensity of light having transmitted through said two light transmissive areas is 100%; and R and r are the major and minor axes of said area of low light transmittance in a substantially oval shape.

According to the fourth aspect of the invention, any one of the pupil filter-formation diffractive optical devices according to the first to third aspects is further characterized in that said diffractive optical device is a computer-generated hologram device.

According to the fifth aspect of the invention, there is an aligner provided, which directs light emanating from a light source to a mask via an illumination optical system, and projects a pattern on said mask onto an alignment substrate and exposing that pattern to light, characterized by comprising a pupil filter-formation diffractive optical device as recited in any one of the first to fourth aspects of the invention.

BRIEF DESCRIPTION OF THE DRAWINGS

Fig. is a schematic top view of the pupil filter formed by the diffractive optical system of the invention.

FIG. 10 is a top schematic view of an exemplary prior art pupil filter configuration.

FIG. 11 is illustrative of the relations of the mask pattern pitch to diffracted light of illumination light having transmitted through the pupil filter.

BEST MODE FOR CARRYING OUT THE INVENTION

Embodiments of the inventive diffractive optical device, pupil filter formed using that and aligner are now explained with reference to the accompanying drawings.

(Diffractive Optical Device)

In the invention, the aforesaid object is accomplished without using an aperture, i.e., by forming a pupil filter morphology having the desired light intensity profile at a position of that aperture using a diffractive optical device. Preferable for such a diffractive optical device is one comprising a computer-generated hologram or the like that is previously designed in such a way as to generate at the position of the aperture a light pattern of the desired light intensity profile for a dipole fan-form pupil. The computer-generated hologram is made by calculating an interference fringe pattern obtained by the interference of object light with reference light, and producing the result directly out of a writing system. The interference fringe morphology for obtaining the desired light intensity profile for the reference light may be figured out by optimization using repetitive computation on a computer. The computer-generated hologram device may be fabricated by applying multiple etching stepwise to a transparent synthetic quartz substrate; it is capable of achieving light collection as is the case with a pupil filter.

The pupil filter formed by the inventive diffractive optical device is now explained.

(Pupil Filter)

Figure 1:
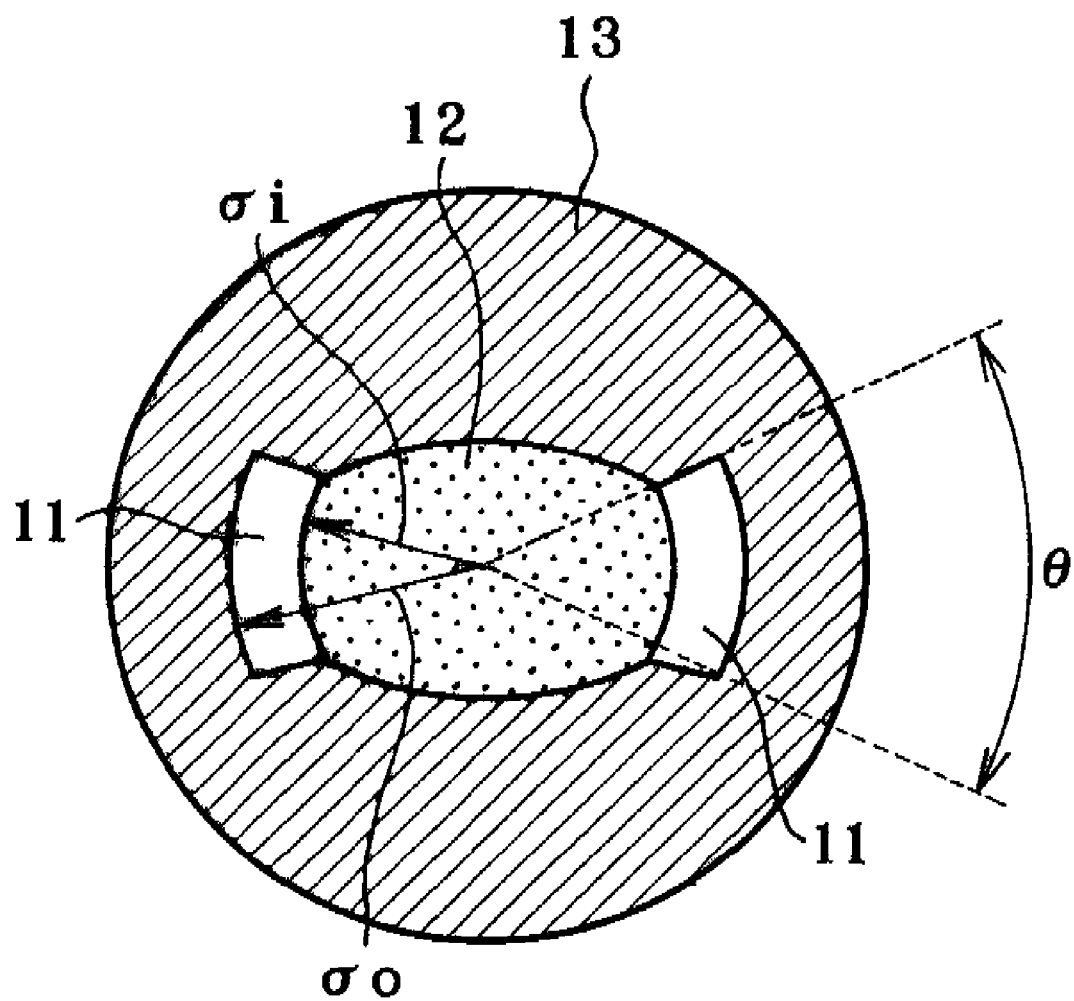

The pupil filter formed by the inventive diffractive optical device is a dipole pupil comprising two light transmissive areas 11 as shown in FIG. 1, characterized in that the two light transmissive areas 11 are in a symmetrical fan-form shape on the diameter of the pupil filter about a given distance from the center of the pupil filter, an area 12 of low light transmittance lies between the two light transmissive areas 11, and there is a light block area 13 (the hatched area) outside the two light transmissive areas 11 and area 12 of low light transmittance.

In the diffractive optical device of the invention, the pupil filter to be formed takes the form of a dipole pupil for the reason that the dipole pupil is more advantageous over a quadrapole pupil: it is higher in resolving power and easier in design. The quadrapole pupil has a complicated design, and the center of that pupil takes a round shape that has lower resolving power and is less likely to produce high performance as compared with the dipole pupil.

In the diffractive optical device of the invention, the pupil filter to be formed has a fan form for the reason that the fan-form dipole pupil is more advantageous or higher than a round one in terms of resolving power.

In the pupil filter formed by the diffractive optical device of the invention, the area 12 of low light transmittance lies between the two fan-form light transmissive areas 11, each in a round, rectangular, near-oval or other form. A near-oval area of low light transmittance is more advantageous and more preferable than a round or rectangular one in terms of optical image contrast and stability.

For more efficient transmission of light, two such fan-form light transmissive areas 11 should have a transmittance of nearly 100%. In the invention, it is possible to give local gradation to the inside of each fan-form light transmissive area 11 by control of partial light transmittance; however, that makes design complicated, and the stability of an optical image insufficient.

Each part of the pupil filter formed by the diffractive optical device of the invention is now explained in more details.

(Each Part of the Pupil Filter)

Reference is now made to the more preferable condition range for each part of the pupil filter.

In the invention, the optimum condition for each part of the pupil filter is found by way of simulation, for which software Prolith 9.2 made by KLA-Tencor Co., Ltd. is used under the common conditions of exposure wavelength: 193 nm, polarization-free, NA: 0.9, pattern width: 65 nm (pattern pitch: 130 nm), and binary mask. In simulation, the condition for each part of the pupil filter is varied to estimate the resolving power (contrast) of an optical image by a mask pattern pitch and contrast stability, thereby determining the preferable range for each part.

In the invention, the resolution of the optical image and the stability of contrast are used as the practical estimation criteria for photolithography, as described above. The resolving power is indicative of how separately an optical image is viewed, and represented by the minimum mask pattern pitch and the then contrast of the optical image: the higher the contrast, the higher the resolving power is. In the invention, the contrast is used as the index to the resolving power. That is, the estimation criterion set for the contrast is that the optical image must have a contrast of at least 0.35 at a mask pattern pitch of 130 nm (pattern width: 65 nm).

The stability of contrast is represented by the range of fluctuations of the contrast of an optical image relative to the mask pattern pitch (hereinafter referred to as the contrast range). According to the estimation criterion set here, when the width of contrast fluctuations from the contrast peak is less than 0.06 at a wide pitch, the contrast is judged as being stable. The smaller the value of the contrast range, the smaller the contrast fluctuations and the higher the contrast stability; so the loads on the correction (OPC) of the mask pattern stays minimized.

(Inner Diameter of the Fan-Form Light Transmissive Areas)

Found first is the optimum range for the inner diameter (the radius here) σi of the two fan-form light transmissive areas 11 of the dipole pupil filter formed by the inventive diffractive optical device and shown in FIG. 1.

Figure 2A:
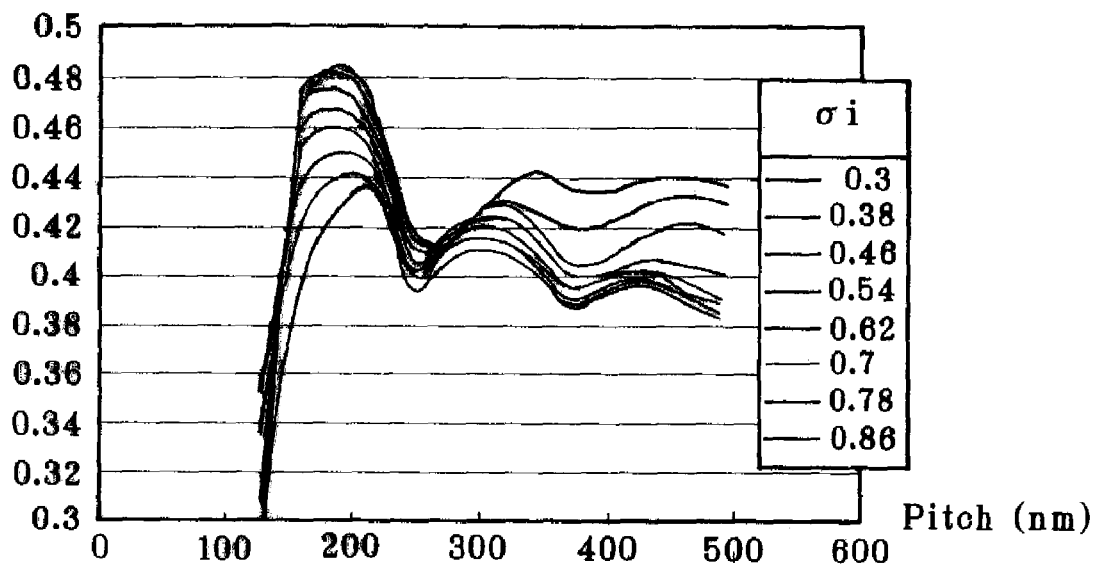
FIG. 2 is illustrative of the optimum range for the inner diameter of the two fan-form light transmissive areas of the pupil filter formed by the diffractive optical device of the invention.
Figure 2B:
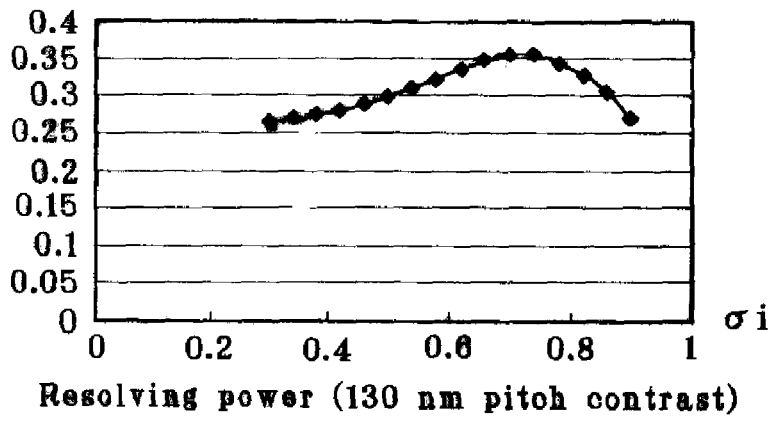
Figure 2C:
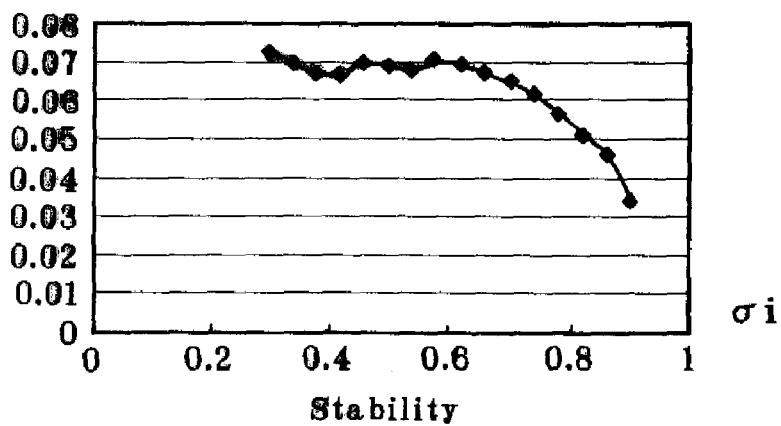

FIG. 2(*a*), with the mask pattern pitch as abscissa and the optical image contrast as ordinate, shows the results of finding the optimum range for the inner diameter of the two fan-form light transmissive areas 11. In the invention, the inner diameter σi of the two fan-form light transmissive areas is increased at an increment of 0.08 from 0.3 to 0.86 at a pupil filter's radius 1.

Further, on the basis of FIG. 2(*a*), the resolving power is shown in FIG. 2(*b*) with the inner diameter σi of the light transmissive areas as abscissa and the optical image contrast at 130 nm as ordinate, and the stability of the optical image is shown in FIG. 2(*c*) with the inner diameter σi of the light transmissive areas as abscissa and the contrast range of the optical image as ordinate.

In the invention, it is preferable that the inner diameter σi is within the range of 0.65<σi<0.75 in consideration of the resolving power and stability of the optical image. As the inner diameter σi is less than 0.65, both the contrast and the resolving power become low, and the resolving power peaks at around the inner diameter a i=0.7. As the inner diameter σi is greater than 0.75, on the other hand, the contrast becomes low. As the inner diameter σi grows large, the contrast range becomes small with an increasing stability; however, there is lower resolving power obtained as mentioned above.

(Outer Diameter of the Fan-Form Light Transmissive Areas)

Found here is the optimum range for the outer diameter (the radius here) σo of the two fan-form light transmissive areas 11 of the dipole pupil filter formed by the inventive diffractive optical device and shown in FIG. 1.

FIG. 3(*a*), with the mask pattern pitch as abscissa and the optical image contrast as ordinate, shows the results of finding the optimum range for the outer diameter σo of the two fan-form light transmissive areas 11. In the invention, the outer diameter σo of the two fan-form light transmissive areas is increased at an increment of 0.02 from 0.72 to 0.94 at a pupil filter's radius 1.

Figure 3A:
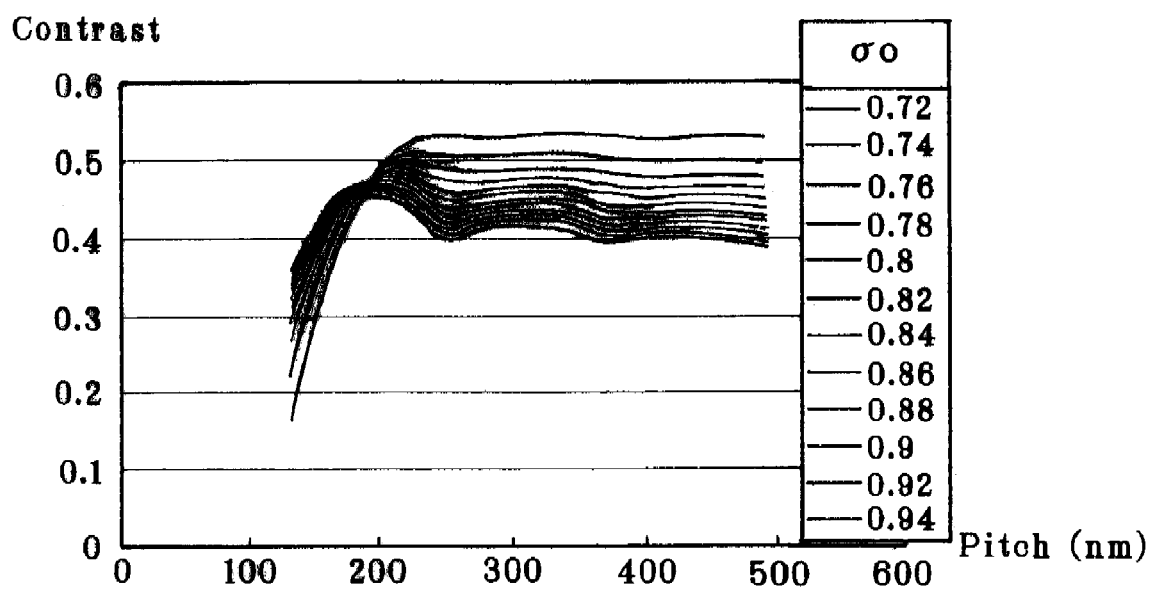
FIG. 3 is illustrative of the optimum range for the outer diameter of the two fan-form light transmissive areas of the pupil filter formed by the diffractive optical device of the invention.
Figure 3B:
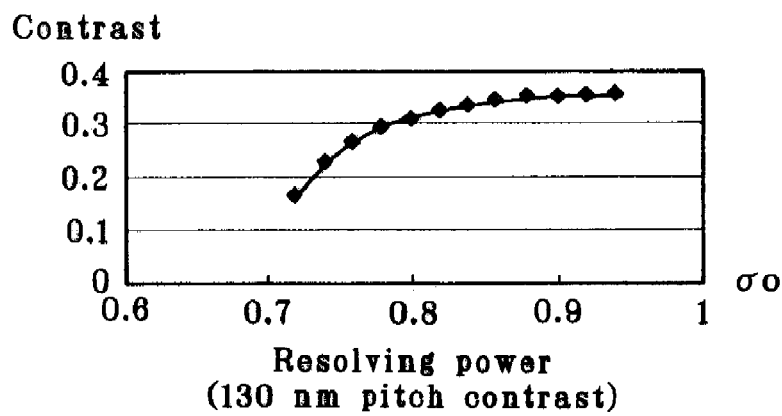
Figure 3C:
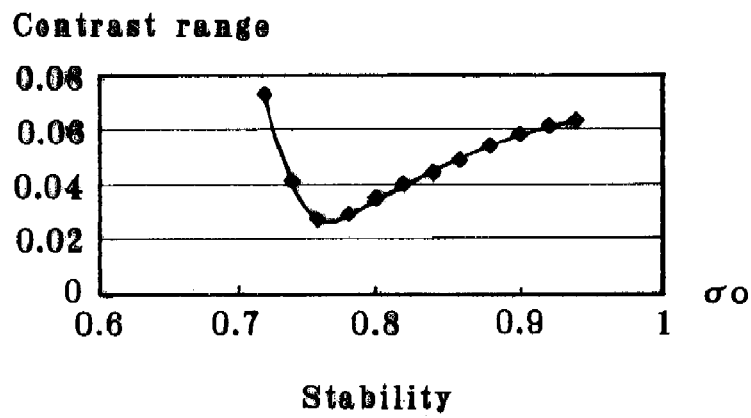

Further, on the basis of FIG. 3(a), the resolving power is shown in FIG. 3(b) with the outer diameter σo of the light transmissive areas as abscissa and the optical image contrast at 130 nm as ordinate, and the stability of the optical image is shown in FIG. 3(c) with the outer diameter σo of the light transmissive areas as abscissa and the contrast range of the optical image as ordinate.

In the invention, as shown in FIGS. 3(a) to 3(c), it is preferable that the outer diameter σo is within the range of 0.8<σo<0.9 in consideration of the resolving power and stability of the optical image. As the outer diameter σo is less than 0.8, both the contrast and the resolving power drop. As the outer diameter σo grows large, it permits the resolving power to grow high, but the resolving power is almost saturated at greater than 0.85. The contrast range becomes erratic when the outer diameter σo is less than 0.7, and minimized and kept stable when it stays at around 0.77. However, as the outer diameter σo grows larger, the contrast range grows larger, but it gets erratic at greater than 0.9.

(Angular Aperture of the Fan-Form Light Transmissive Areas)

Found here is the optimum range for the angular aperture θ at which the two fan-form light transmissive areas 11 of the dipole pupil filter formed by the inventive diffractive optical device and shown in FIG. 1 subtend the center of the pupil filter.

Figure 4A:
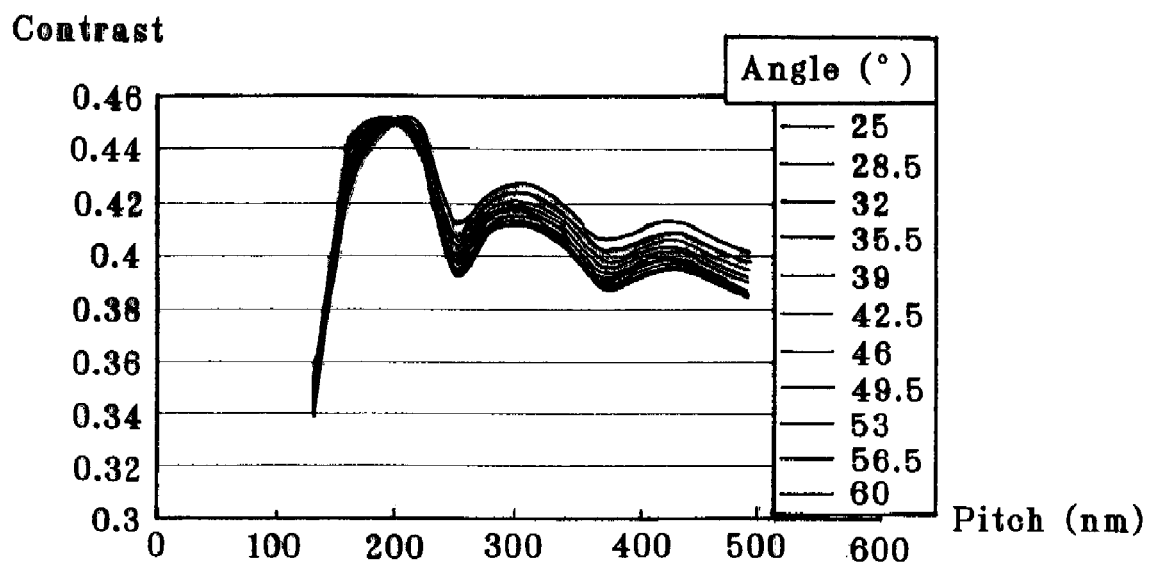
FIG. 4 is illustrative of the optimum range for the angular aperture at which the two fan-form light transmissive areas of the pupil filter formed by the diffractive optical device of the invention subtend the center of the pupil filter.

FIG. 4(a), with the mask pattern pitch as abscissa and the optical image contrast as ordinate, shows the results of finding the optimum range for the angular aperture θ at which the two fan-form light transmissive areas 11 subtend the center of the pupil filter. In the invention, the angular aperture θ at which the two fan-form light transmissive areas 11 subtend the center of the pupil filter is increased at an increment of 3.5° from 25° to 60°.

Figure 4B:
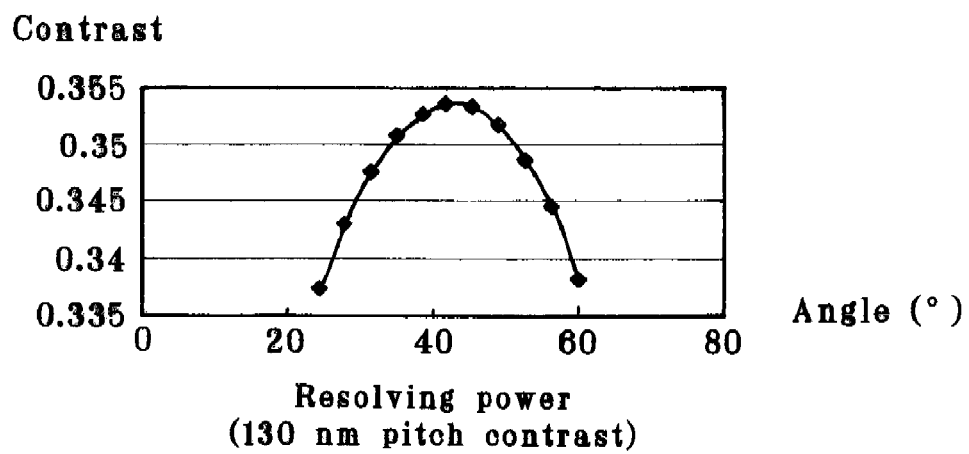
Figure 4C:
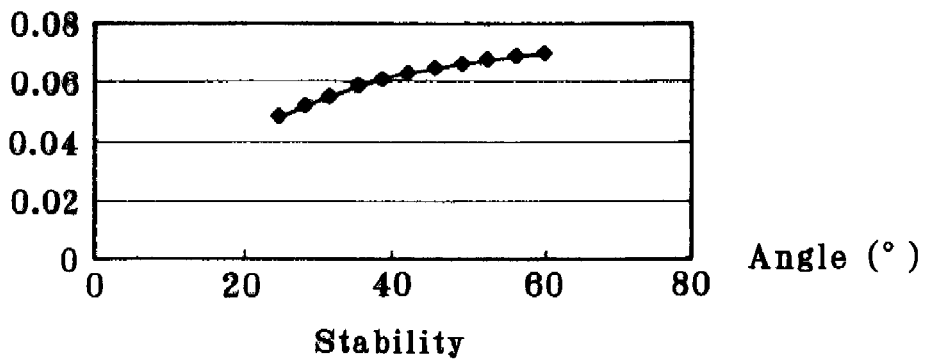

Further, on the basis of FIG. 4(a), the resolving power is shown in FIG. 4(b) with the angular aperture θ (°) as abscissa and the optical image contrast at 130 nm as ordinate, and the stability of the optical image is shown in FIG. 4(c) with the angular aperture θ (°) as abscissa and the contrast range of the optical image as ordinate.

In the invention, as shown in FIGS. 4(a) to 4(c), it is preferable that the angular aperture θ is within the range of 40°<θ<50° in consideration of the resolving power and stability of the optical image. The contrast peaks at an angular aperture θ of around 45°; it declines at less than 39° and greater than 53°. In an area where the angular aperture θ is small, the contrast range grows small and stable, and the contrast range grows large with an increasing angular aperture θ but it is going to get erratic at greater than 50°.

(Intensity of Light through the Area of Low Light Transmittance)

Found here is the optimum range for the intensity of light having transmitted through the near-oval area 12 of low light transmittance of the dipole pupil filter formed by the inventive diffractive optical device and shown in FIG. 1.

Figure 5A:
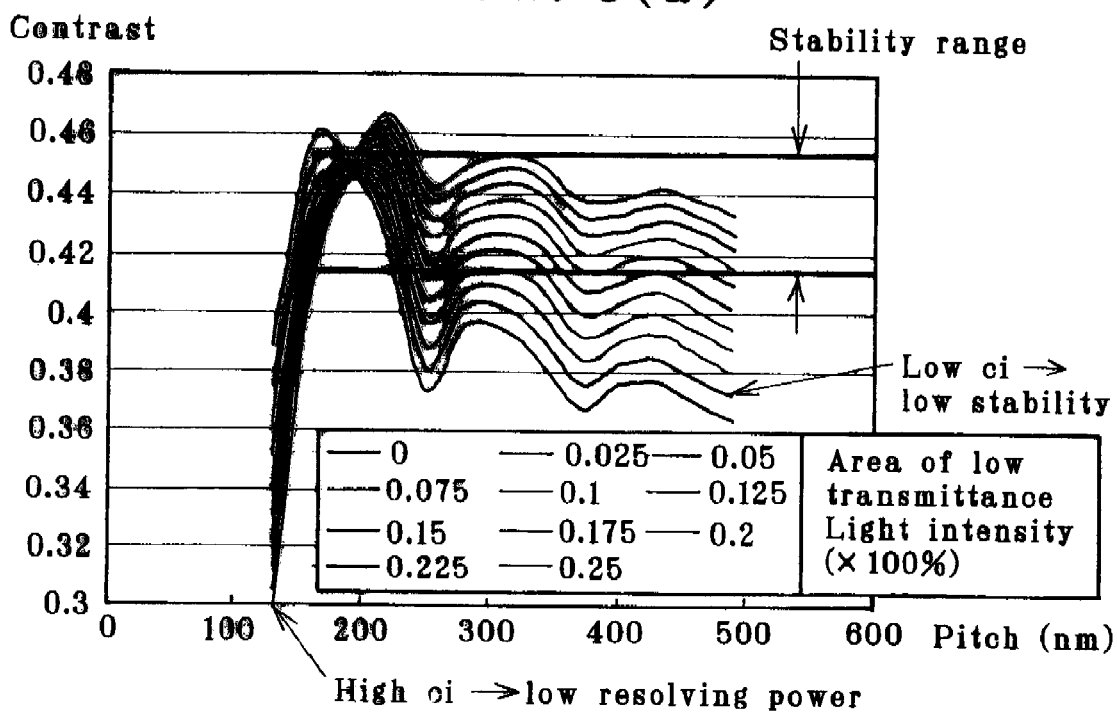
FIG. 5 is illustrative of the optimum range for the intensity of light having transmitted through the area of low light transmittance of the pupil filter formed by the diffractive optical device of the invention.

FIG. 5(a), with the mask pattern pitch as abscissa and the optical image contrast as ordinate, shows the results of finding the optimum range for the intensity (ci) of light having transmitted through the near-oval area 12 of low light transmittance of the dipole pupil filter. In the invention, the intensity (ci) of light having transmitted through the area 12 of low light transmittance is increased at an increment of 2.5% from 0% to 25% provided that the intensity of light having transmitted through the two fan-form light transmissive areas 11 is 100%.

Figure 5B:
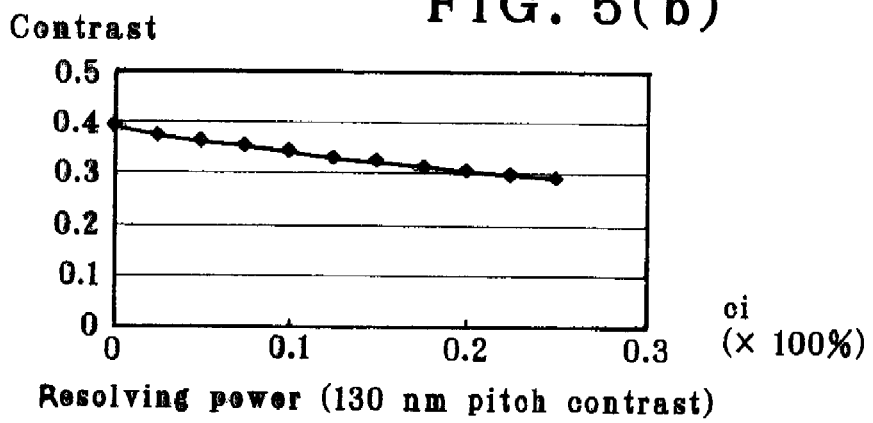
Figure 5C:
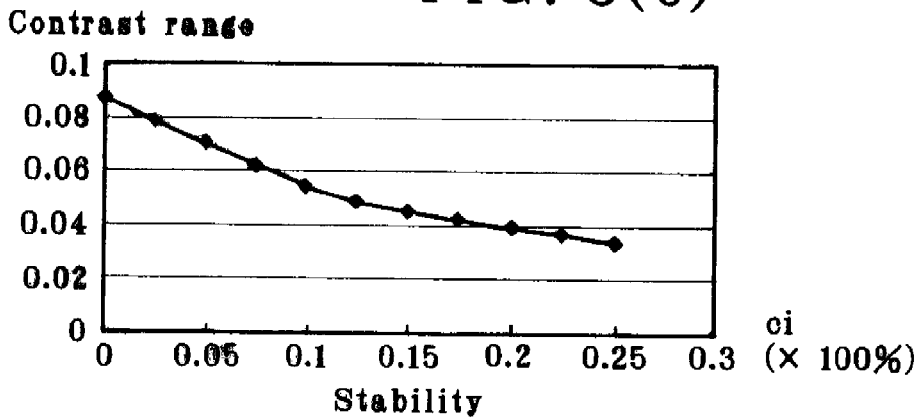

Further, on the basis of FIG. 5(a), the resolution is shown in FIG. 5(b) with the light intensity ci as abscissa and the optical image contrast at 130 nm as ordinate, and the stability of the optical image is shown in FIG. 5(c) with the light intensity ci as abscissa and the contrast range of the optical image as ordinate.

In the invention, as shown in FIG. 5(a) to 5(c), it is preferable that the light intensity ci is within the range of 5%<ci<10%, especially 7%<ci<10%, in consideration of the resolving power and stability of the optical image. This is because the contrast stability gets worse at a light intensity ci of less than 5% whereas the resolving power declines at a light intensity ci of greater than 10%.

(Major/Minor Axes of the Near-Oval Area)

Found here is the optimum range for major-to-minor axis ratio of the near-oval area 12 of low light transmittance of the dipole pupil filter formed by the inventive diffractive optical device and shown in FIG. 1.

Figure 6A:
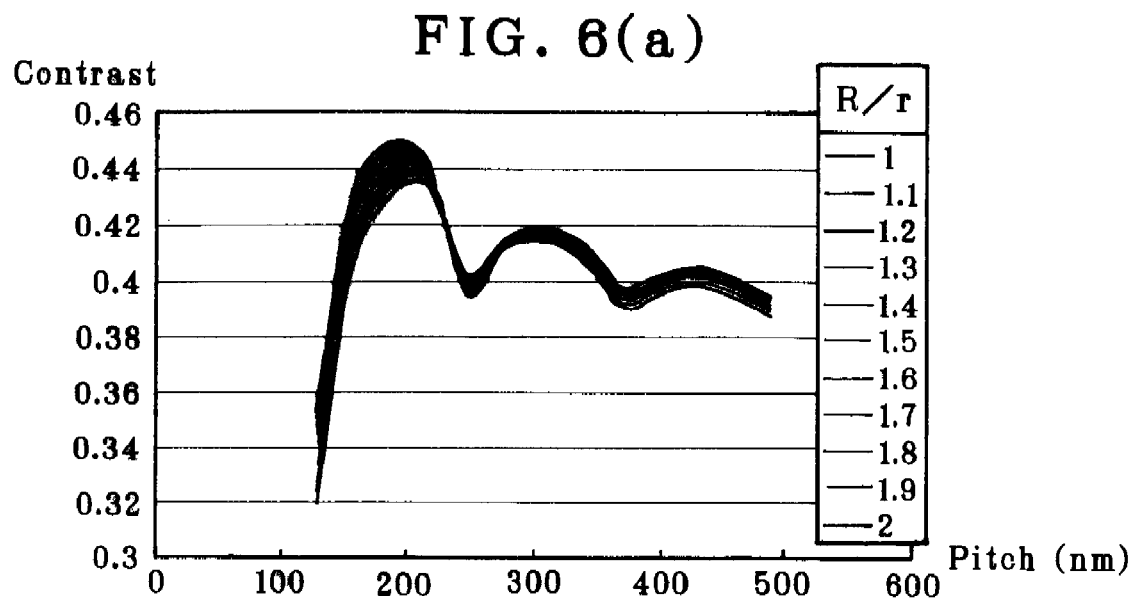
FIG. 6 is illustrative of the optimum range for the ratio of the major-to-minor axis of the substantially oval area of low light transmittance of the pupil filter formed by the diffractive optical device of the invention.

FIG. 6(a), with the mask pattern pitch as abscissa and the optical image contrast as ordinate, shows the results of finding the optimum range for the major-to-minor axis ratio of the near-oval area 12 of low light transmittance of the dipole pupil filter. In the invention, the major-to-minor axis ratio R/r of the near-oval area 12 of low light transmittance is increased at an increment of 0.1 from 1 to 2, where R is the major axis and r is the minor axis of the near-oval area 12.

Figure 6B:
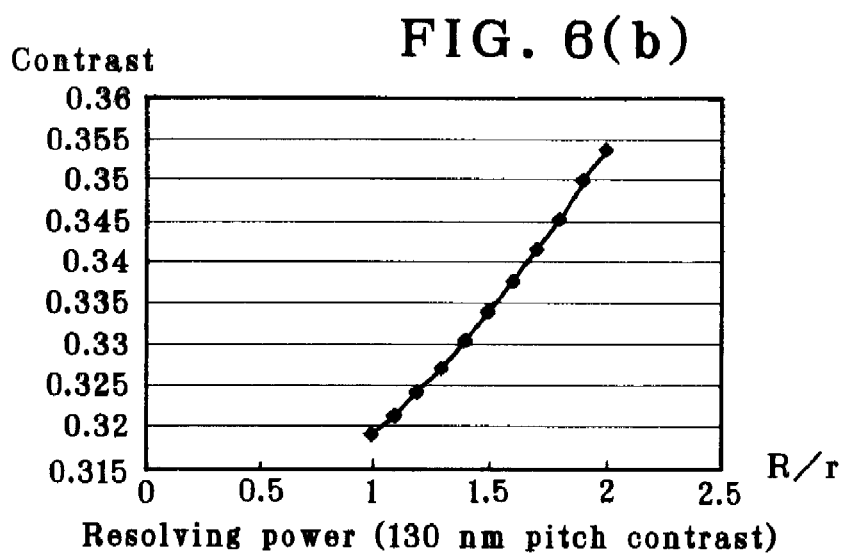
Figure 6C:
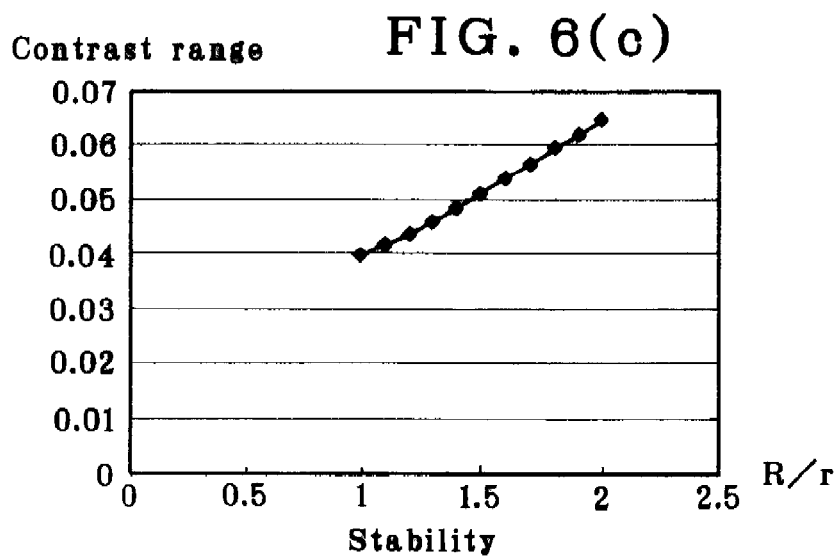

Further, on the basis of FIG. 6(a), the resolution is shown in FIG. 6(b) with the major-to-minor axis ratio of the ellipse R/r as abscissa and the optical image contrast at 130 nm as ordinate, and the stability of the optical image is shown in FIG. 6(c) with the major-to-minor axis ratio of the ellipse R/r as abscissa and the contrast range of the optical image as ordinate.

In the invention, as shown in FIG. 6(a) to 6(c), it is preferable that the major-to-minor axis ratio R/r is within the range of 1.5<R/r<1.9 in consideration of the resolution and stability of the optical image. This is because the contrast becomes low with a decreasing resolving power at a major-to-minor axis ratio R/r of less than 1.5 whereas the contrast range grows large with an erratic contrast stability at a major-to-minor axis ratio R/r of greater than 1.9.

(Fabrication of the Diffractive Optical Device)

A known fabrication process may be applied to the fabrication of the computer-generated hologram device used for the diffractive optical device of the invention. For instance, as set forth in JP(A)2002-350623, a diffractive optical device having a fine-pitch relief may be fabricated by a photomask fabrication technique in combination with photolithography, wherein a transparent synthetic quartz substrate is subjected to multiple etching (for instance, two, four, or eight steps).

Figure 7:
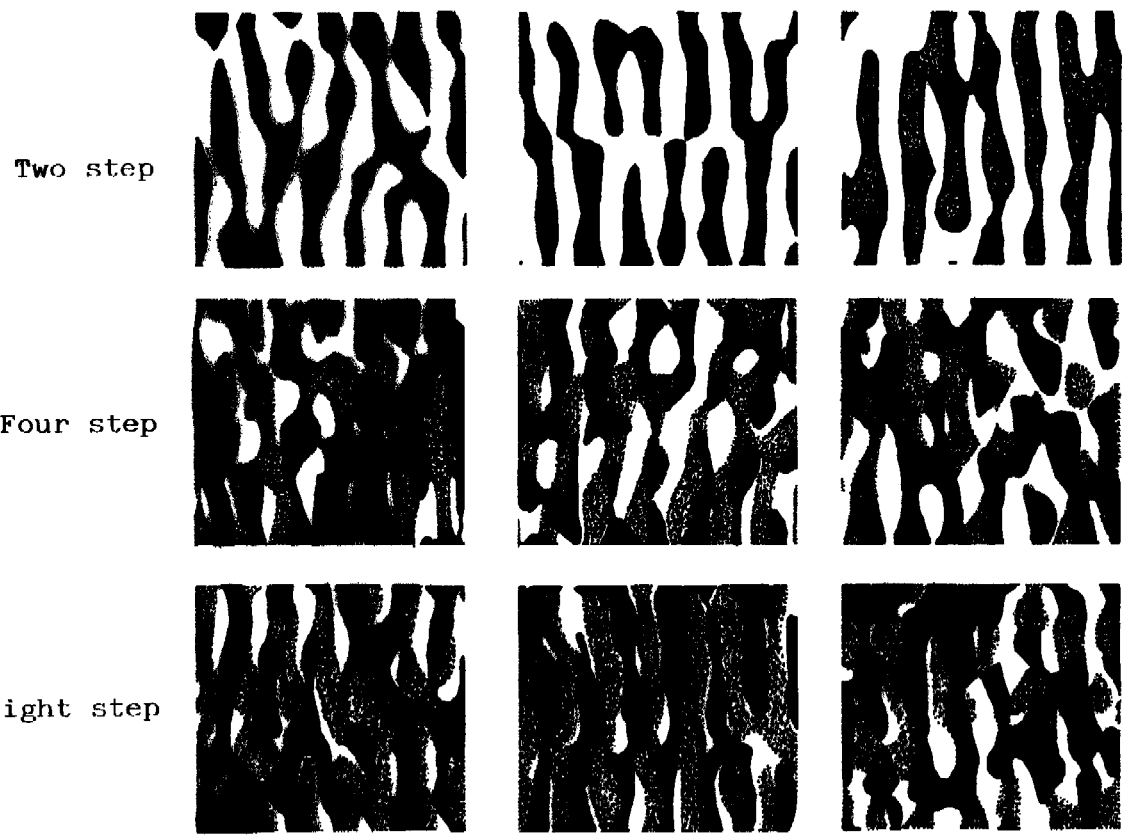
FIG. 7 is an enlarged photograph showing the top surface of an exemplary inventive computer-generated hologram device.

FIG. 7 is an enlarged photograph taken of the top surface of one exemplary computer-generated hologram device fabricated by the processing of synthetic quartz. The pattern configuration of the computer-generated hologram device shown in FIG. 7 may be optimized by use of repetitive computation on a computer. FIG. 7 shows that computer-generated hologram devices are fabricated at a varying exit angle (α) and pitch and in two, four, and eight steps. In FIG. 7, the light collection efficiencies of illumination light in the two, four and eight steps are 45%, 80% and 90%, respectively.

Therefore, if the four- or eight-step hologram device of the invention is used as the pupil filter-formation diffractive optical device for the illumination optical system of an aligner, it is then possible to obtain a pupil filter that has a light collection efficiency of as high as 80% or greater and so is capable of yielding a stable optical image.

Figure 8:
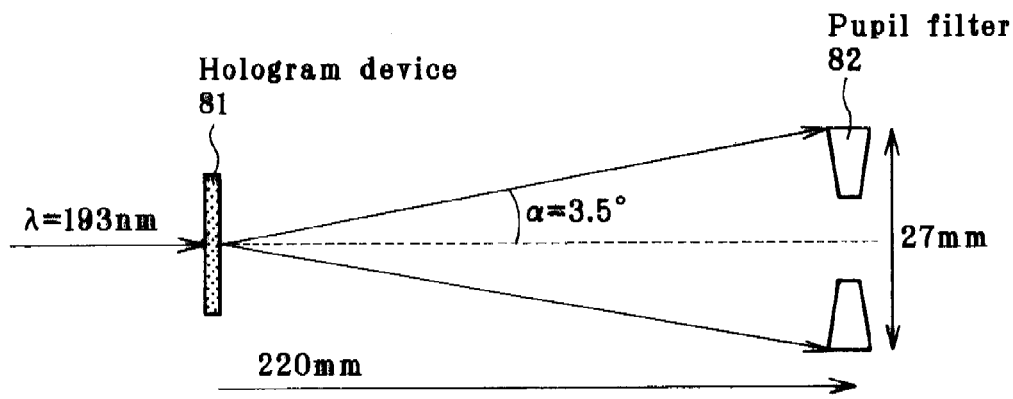
FIG. 8 is illustrative of an example of entering illumination light in the inventive computer-generated hologram device thereby forming a dipole fan-form pupil filter.
Figure 9:
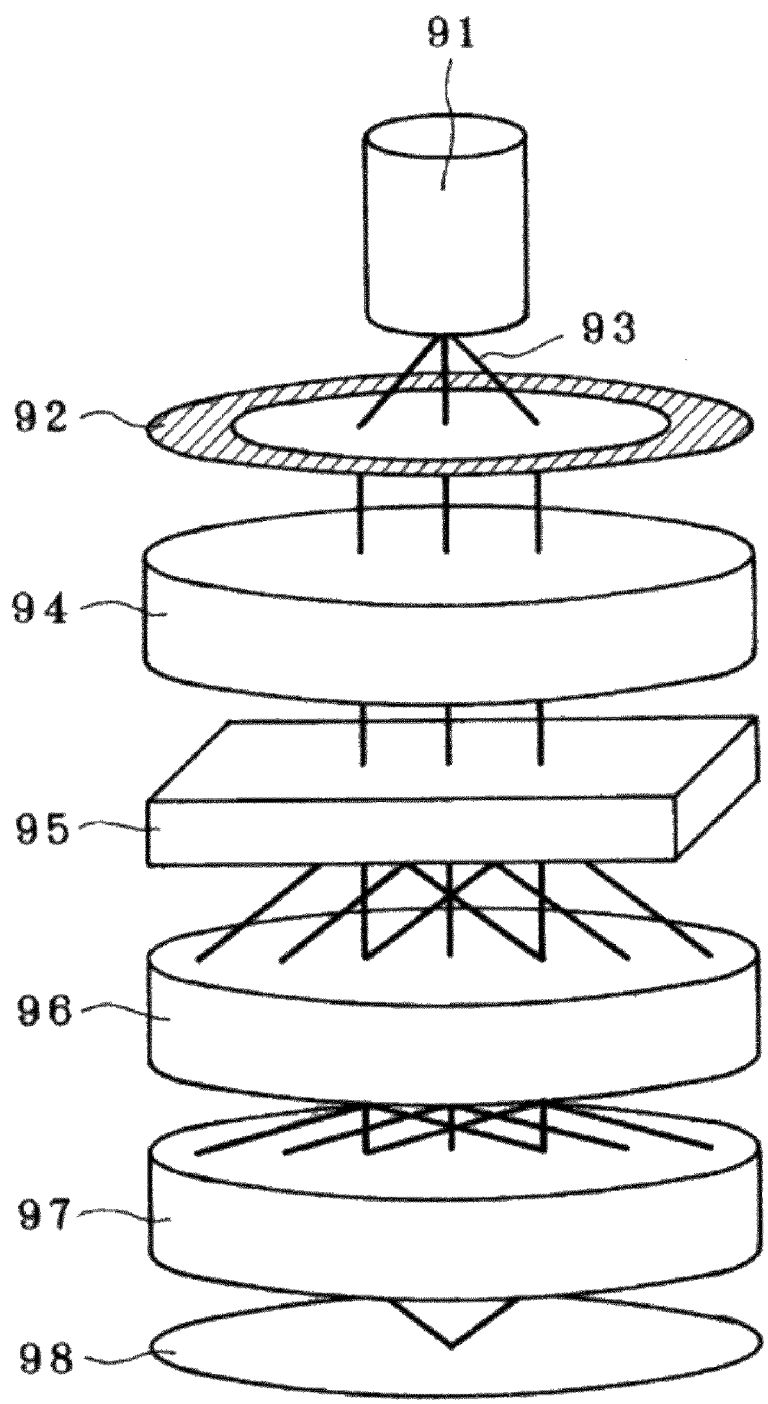
FIG. 9 is illustrative in schematic of the general setup of an aligner system in a semiconductor projection aligner.
Figure 12A:
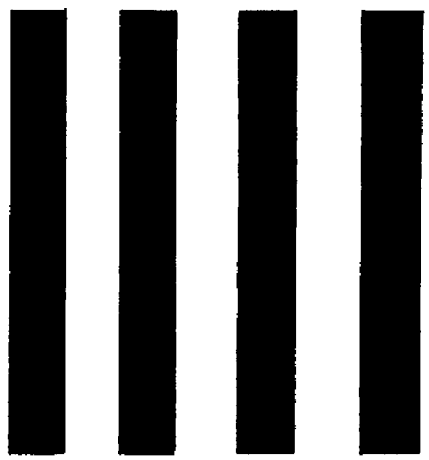
FIG. 12 is a schematic top view of the pattern showing a mask pattern pitch.
Figure 12B:
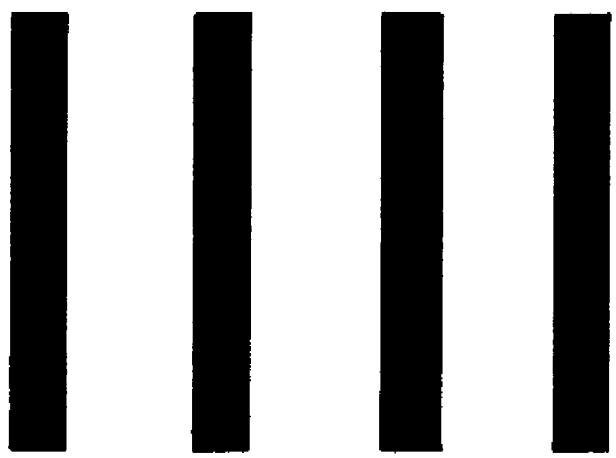
Figure 13:
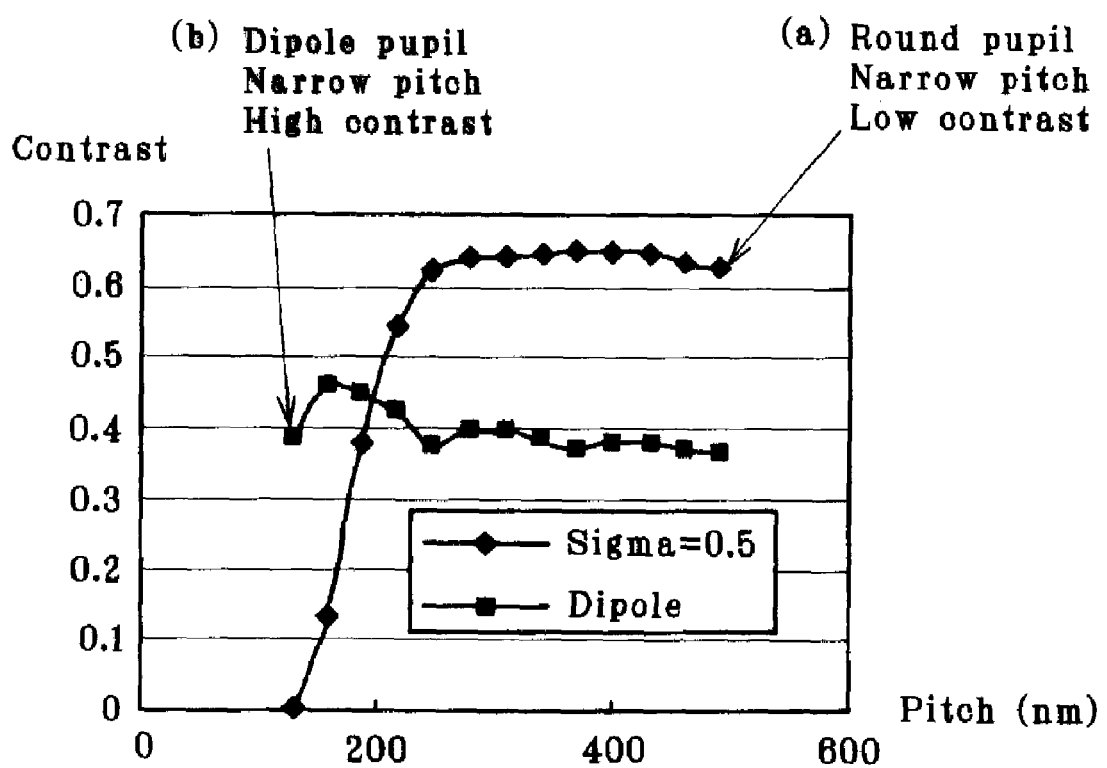
FIG. 13 is illustrative of the relations of the mask pattern pitch to the coherence of illumination light leaving the pupil filter.

FIG. 8 is illustrative of the irradiation of the hologram device of FIG. 7 with an ArF excimer laser at a wavelength of 193 nm. A light beam incident on a computer-generated hologram device 81 is diffracted upon amplitude or phase modulation at the computer-generated hologram device 81, and then leaves it at a constant exit angle α (for instance, α=3.5°, 4.0°, 5.0°) to form a dipole pupil filter 82 (the pupil outer diameter σo=27/2 mm) having fan-form light transmissive areas having a desired illuminance profile. Note here that only the light transmissive areas of the pupil filter 82 are shown with the rest being left out. The computer-generated hologram device 81 and pupil filter 82 are located at such positions as to mutually meet the Fourier transform plane relation.

(Aligner)

In the invention, the aligner is designed such that light emanating from a light source is directed to a mask via an illumination optical system, and a pattern on the mask is then projected and exposed to light on an alignment substrate via a projection optical system, and comprises the aforesaid pupil filter-formation diffractive optical device according to the invention.

Various aligners may be used, provided that the pupil filter-formation diffractive optical device of the invention can be applied to them. For instance, an ArF excimer laser having a wavelength of 193 nm, and a KrF excimer laser having a wavelength of 248 nm may be used as an exposure light source.

EXAMPLES

The invention is now explained in further details with reference to one specific example. This example is directed to a computer-generated hologram device having design specifications: the minimum pitch of the basic diffraction grating of 4,000 nm, the exit angle of 3.5° upon irradiation with illumination light, the 8 phase steps, and the transparent synthetic quartz substrate workpiece. Note here that the height specifications for each step were 193 nm, and the value of each part of the dipole pupil filter having two fan-form light transmissive areas formed by use of this diffractive optical device, too, was designed beforehand.

First, there was a photomask substrate readied up, which had a metal chromium film formed on one surface of an optically polished, transparent synthetic quartz substrate of 6 inches square and 6.35 mm thickness. After a positive type EB resist (ZEP7000 made by Nippon Zeon Co., Ltd.) was coated by rotational coating on the metal chromium film, data for writing exposure were used for pattern exposure on an electron beam lithography system, and development was carried out with a given developer.

Then, the metal chromium film exposed out of an opening in the resist was dry etched using a chlorine gas to provide an opening out of which the surface of quartz was exposed. Then, using the resist and metal chromium layer as an etching-resistant layer, dry etching was carried out with a fluorine gas to apply etching to the quartz workpiece by one step of height.

Then, after removal of the resist layer with a given stripper, a positive type i-line resist (THMR-iP3500 made by Tokyo Ohka Kogyo Co., Ltd.) was coated by rotational coating all over the processed side of the workpiece, and data for writing exposure were used in combination with a laser lithography system having an alignment function (ALTA 3000 made by ETEC Co., Ltd.) to implement pattern exposure, followed by development with a given developer. Then, the metal chromium film exposed out of an opening in the resist was similarly dry etched using a chlorine gas to provide an opening out of which the surface of quartz was exposed. Then, using the resist and metal chromium layer as an etching-resistant layer, dry etching was carried out with a fluorine gas to apply etching to the quartz workpiece by two steps of height.

Further, after removal of the resist layer with a given stripper, a positive type i-line resist (THMR-iP3500 made by Tokyo Ohka Kogyo Co., Ltd.) was similarly coated by rotational coating all over the processed side of the workpiece, and data for writing exposure were used in combination with a laser lithography system having an alignment function (ALTA 3000 made by ETEC Co., Ltd.) to implement pattern exposure, followed by development with a given developer. Then, the metal chromium film exposed out of an opening in the resist was similarly dry etched using a chlorine gas to provide an opening out of which the surface of quartz was exposed. Then, using the resist and metal chromium layer as an etching-resistant layer, dry etching was carried out with a fluorine gas to apply etching to the quartz work piece by four steps of height.

After removal of the remaining resist and metal chromium film, there was an assembly obtained, which had a wall (which might often be in a projection form) at the boarder between the adjoining steps. Then, the assembly was dipped in a 10 wt % aqueous solution of sodium hydroxide heated to 70° C. to wet etch the whole for removal of the walls, thereby obtaining a computer-generated hologram device acting as a diffractive optical device having eight steps, an exit angle of 3.5° and a minimum pitch of 4,000 nm.

Then, as shown in FIG. 8, an excimer laser of 193 nm wavelength was directed as illumination light to the aforesaid computer-generated hologram. As a result, the incident light beam was diffracted through the computer-generated hologram, leaving it at an exit angle of 3.5°, thereby yielding a dipole pupil filter having fan-form light transmissive areas at a distance of 220 mm. As originally designed, this pupil filter had two fan-form light transmissive areas symmetric at a distance of 13.5 mm of their outer diameter from the center of the pupil filter, with an angular aperture of 45° and a near-oval area having a light transmittance of as low as 7.5% between two such light transmissive areas. Outside the two light transmissive areas and the area of low light transmittance there was a light block area present to block off light. The major-to-minor axis ratio of the near-oval shape was 1.7.

Then, the aforesaid computer-generated hologram device was installed in the illumination optical system of a semiconductor projection aligner using an excimer laser of 193 nm wavelength as a light source, and after a resist on a wafer was exposed to light using a mask having a pattern having a minimum pattern pitch of 90 nm, the resist was developed. It was consequently found that a resist pattern having a minimum pattern pitch of 90 nm was formed, and a resist pattern was similarly for other pattern likewise in a stable manner, too. The use of this computer-generated hologram device allowed the exposure time to be shorter than could be achieved with a conventional aperture pupil filter.

INDUSTRIAL APPLICABILITY

With the pupil filter set up by use of the inventive diffractive optical device, it is possible to achieve the light intensity profile of the pupil filter as desired, enhance the transmission efficiency of illumination light, and improve the productivity of semiconductors at the exposure step.

The diffractive optical device of the invention, because of being capable of keeping the stability of an optical image high, allows for a decrease in the loads of correction by the optical proximity effect on a semiconductor circuit pattern. There is none of the size fluctuations of the pattern imaged on a wafer depending on a mask pattern pitch, and this works for obtaining an optical image of high resolution stably, which means that small-area, fast, low-power semiconductor devices can be achieved with high productivity.

Thus, by use of a projection aligner with the inventive diffractive optical device installed in an illumination system, it is possible to produce high-quality yet low-cost semiconductor devices in general, and semiconductor devices having a half pitch of 65 nm or less in particular.

What we claim is:

1. A pupil filter-formation diffractive optical device comprising:
    a dipole pupil filter having two light transmissive areas,
    wherein said two light transmissive areas are in a fan-like shape symmetric about a given distance from a center of said pupil filter,
    an area of low light transmittance is provided between and connecting said two light transmissive areas with a width at least equal to that of the poles, and there is a light block area outside said two light transmissive areas and said area of low light transmittance,
    wherein said area of low light transmittance is in a substantially oval shape
    characterized in that parameters $\sigma i$, $\sigma o$ and $\theta$ are within the following ranges, and parameters $ci$ and $R/r$ are within the following ranges:

$0.65 < \sigma i < 0.75$ $0.8 < \sigma o < 0.9$ $40° < \theta < 50°$ $5\% < ci < 10\%$ $1.5 < R/r < 1.9$ where $\sigma i$ and $\sigma o$ are the inner and outer diameters of each of said two light transmissive areas; $\theta$ is the angular aperture at which said two light transmissive areas subtend the center of said pupil filter; 1 is the radius of said pupil filter; $ci$ is the intensity of light having transmitted through said area of low light transmittance provided that the intensity of light having transmitted through said two light transmissive areas is 100%; and R and r are the major and minor axes of said area of low light transmittance in a substantially oval shape.

2. The pupil filter-formation diffractive optical device according to claim 1, characterized in that said diffractive optical device is a computer-generated hologram device.

3. An aligner, which directs light emanating from a light source to a mask via an illumination optical system, and projects a pattern on said mask onto an alignment substrate via a projection optical system and exposing that pattern to light, characterized by comprising a pupil filter-formation diffractive optical device as recited in claim 1.

* * * * *